US012796293B2

(12) United States Patent
Lee et al.

(10) Patent No.: US 12,796,293 B2
(45) Date of Patent: Nov. 10, 2026

(54) DISPLAY DEVICE HAVING A SCATTERING PATTERN AND COLOR FILTER

(71) Applicant: Samsung Display Co., Ltd., Yongin-si (KR)

(72) Inventors: Jinwoo Lee, Yongin-si (KR); Donghoon Kwak, Yongin-si (KR); Yoolguk Kim, Yongin-si (KR); Jiyoon Kim, Yongin-si (KR); Hyeonsik Kim, Yongin-si (KR); Heewoon Im, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 469 days.

(21) Appl. No.: 18/470,637

(22) Filed: Sep. 20, 2023

(65) Prior Publication Data

US 2024/0164188 A1 May 16, 2024

(30) Foreign Application Priority Data

Nov. 10, 2022 (KR) ........................ 10-2022-0149548

(51) Int. Cl.
*H10K 59/80* (2023.01)
*H10K 59/122* (2023.01)

(52) U.S. Cl.
CPC ......... *H10K 59/877* (2023.02); *H10K 59/873* (2023.02)

(58) Field of Classification Search
CPC ......................... H10K 59/8791; H10K 59/122
See application file for complete search history.

(56) References Cited

U.S. PATENT DOCUMENTS

| | | | | |
|---|---|---|---|---|
| 6,969,948 | B2 | 11/2005 | Urabe et al. | |
| 11,532,674 | B2 * | 12/2022 | Kim | H10K 59/38 |
| 2014/0355124 | A1 | 12/2014 | Ju et al. | |
| 2022/0246684 | A1 | 8/2022 | Kim et al. | |
| 2022/0278173 | A1 | 9/2022 | Kong et al. | |
| 2023/0157121 | A1 * | 5/2023 | Won | H10K 59/877 257/40 |
| 2024/0130206 | A1 * | 4/2024 | Kim | H10K 59/40 |
| 2024/0164146 | A1 * | 5/2024 | Im | H10K 59/873 |
| 2024/0215413 | A1 * | 6/2024 | Hwang | H10K 59/38 |

FOREIGN PATENT DOCUMENTS

| | | |
|---|---|---|
| CN | 109860249 | 6/2019 |
| JP | 2003-234186 | 8/2003 |
| KR | 10-2003-0047761 | 6/2003 |
| KR | 10-2067163 | 1/2020 |
| KR | 10-2021-0005453 | 1/2021 |
| KR | 10-2022-0110409 | 8/2022 |

* cited by examiner

*Primary Examiner* — Joseph L Williams
(74) *Attorney, Agent, or Firm* — CANTOR COLBURN LLP

(57) ABSTRACT

A display device includes a display panel including a first light-emitting element disposed in a first light-emitting region, and a thin-film encapsulation layer disposed in the first light-emitting region and a non-light-emitting region adjacent to the first light-emitting region and covering the first light-emitting element, a first scattering pattern disposed on the thin-film encapsulation layer and overlapping the first light-emitting element in a plan view, and a first color filter covering the first scattering pattern.

20 Claims, 8 Drawing Sheets

DISPLAY DEVICE HAVING A SCATTERING PATTERN AND COLOR FILTER

CROSS REFERENCE TO RELATED APPLICATION(S)

This application claims priority to and the benefits of Korean Patent Application No. 10-2022-0149548 under 35 U.S.C. § 119, filed on Nov. 10, 2022, in the Korean Intellectual Property Office (KIPO), the entire contents of which are incorporated herein by reference.

BACKGROUND

1. Technical Field

The disclosure relates to a display device including scattering patterns.

2. Description of the Related Art

A display device may include a display panel and an input sensor. External light is reflected on a structure of the display device. The reflected light decreases the visibility of images. The display device may include a structure for reducing an external light reflectance.

A white angle difference (hereinafter, WAD) phenomenon that the color of a white image changes according to a viewing angle may occur. The WAD phenomenon is also called color shift of a white image. The WAD phenomenon occurs in case that light in a specific wavelength is provided toward a specific azimuthal angle and/or a specific viewing angle.

SUMMARY

Embodiments of the disclosure provide a display device with improved display quality.

According to an embodiment of the disclosure, a display device may include a display panel including a first light-emitting element disposed in a first light-emitting region, and a thin-film encapsulation layer disposed in the first light-emitting region and a non-light-emitting region adjacent to the first light-emitting region and covering the first light-emitting element, a first scattering pattern disposed on the thin-film encapsulation layer and overlapping the first light-emitting element in a plan view, and a first color filter covering the first scattering pattern.

In an embodiment, the display device may further include a second color filter disposed on the first color filter, overlapping the first color filter in a plan view, and not overlapping the first scattering pattern in a plan view, and an overcoat layer covering the first color filter and the second color filter.

In an embodiment, the display device may further include a second scattering pattern disposed on the thin-film encapsulation layer. The display panel may further include a second light-emitting element disposed in a second light-emitting region spaced apart from the first light-emitting region with the non-light-emitting region disposed between the first light-emitting region and the second light-emitting region. The second scattering pattern may overlap the second light-emitting element in a plan view. The second color filter may cover the second scattering pattern.

In an embodiment, the first scattering pattern and the second scattering pattern may include substantially a same material.

In an embodiment, the display device may further include a second color filter disposed on the first color filter and including an opening corresponding to the first scattering pattern, and an overcoat layer covering the first color filter and the second color filter.

In an embodiment, the display panel may further include a pixel defining layer having an opening. The first light-emitting element may include a first electrode exposed by the opening, a light-emitting structure disposed on the first electrode, and a second electrode disposed on the light-emitting structure and contacting an upper surface of the pixel defining layer. The light-emitting structure may include a hole control pattern, a light-emitting pattern disposed on the hole control pattern, and an electron control pattern disposed on the light-emitting pattern.

In an embodiment, the first color filter may contact the first scattering pattern.

In an embodiment, the first scattering pattern may include a base resin and scattering particles mixed in the base resin.

In an embodiment, the thin-film encapsulation layer may include a first inorganic encapsulation layer, an organic encapsulation layer disposed on the first inorganic encapsulation layer, and a second inorganic encapsulation layer disposed on the organic encapsulation layer. The first inorganic encapsulation layer may include a plurality of inorganic layers. A refractive index of one of the plurality of inorganic layers disposed on a lowermost layer may be less than refractive indices of one of the plurality of inorganic layers disposed in the lowermost layer and the second inorganic encapsulation layer.

In an embodiment, the display device may further include an input sensor disposed between the thin-film encapsulation layer and the first scattering pattern.

According to an embodiment of the disclosure, a display device may include a display panel including a first light-emitting element disposed in a first light-emitting region, and a thin-film encapsulation layer disposed in the first light-emitting region and a non-light-emitting region adjacent to the first light-emitting region and covering the first light-emitting element, a first color filter disposed on the thin-film encapsulation layer and overlapping the first light-emitting element in a plan view, a second color filter disposed on the first color filter and including an opening corresponding to the first light-emitting element, and a first scattering pattern disposed in the opening of the second color filter.

In an embodiment, the display device may further include an inorganic layer disposed on the second color filter and the first scattering pattern.

In an embodiment, the inorganic layer may have a refractive index in a range of about 1.6 to about 2.0.

In an embodiment, the display device may further include an overcoat layer covering the inorganic layer.

In an embodiment, the display device may further include a second scattering pattern. The display panel may further include a second light-emitting element disposed in a second light-emitting region spaced apart from the first light-emitting region with the non-light-emitting region disposed between the first light-emitting region and the second light-emitting region in a plan view, and a third color filter disposed on the second color filter and including an opening corresponding to the second light-emitting element. The second color filter may overlap the second light-emitting element in a plan view. The second scattering pattern may be disposed in the opening of the third color filter.

In an embodiment, the first scattering pattern and the second scattering pattern may include substantially a same material.

In an embodiment, the display panel may further include a pixel defining layer having an opening. The first light-emitting element may include a first electrode exposed by the opening of the pixel defining layer, a light-emitting structure disposed on the first electrode, and a second electrode disposed on the light-emitting structure and contacting an upper surface of the pixel defining layer. The light-emitting structure may include a hole control pattern, a light-emitting pattern disposed on the hole control pattern, and an electron control pattern disposed on the light-emitting pattern.

In an embodiment, the first color filter may contact the first scattering pattern.

In an embodiment, the first scattering pattern may include a base resin and scattering particles mixed in the base resin.

In an embodiment, the thin-film encapsulation layer may include a first inorganic encapsulation layer, an organic encapsulation layer disposed on the first inorganic encapsulation layer, and a second inorganic encapsulation layer disposed on the organic encapsulation layer. The first inorganic encapsulation layer may include a plurality of inorganic layers. A refractive index of one of the plurality of inorganic layers disposed on a lowermost layer may be less than refractive indices of one of the plurality of inorganic layers disposed in the lowermost layer and the second inorganic encapsulation layer.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
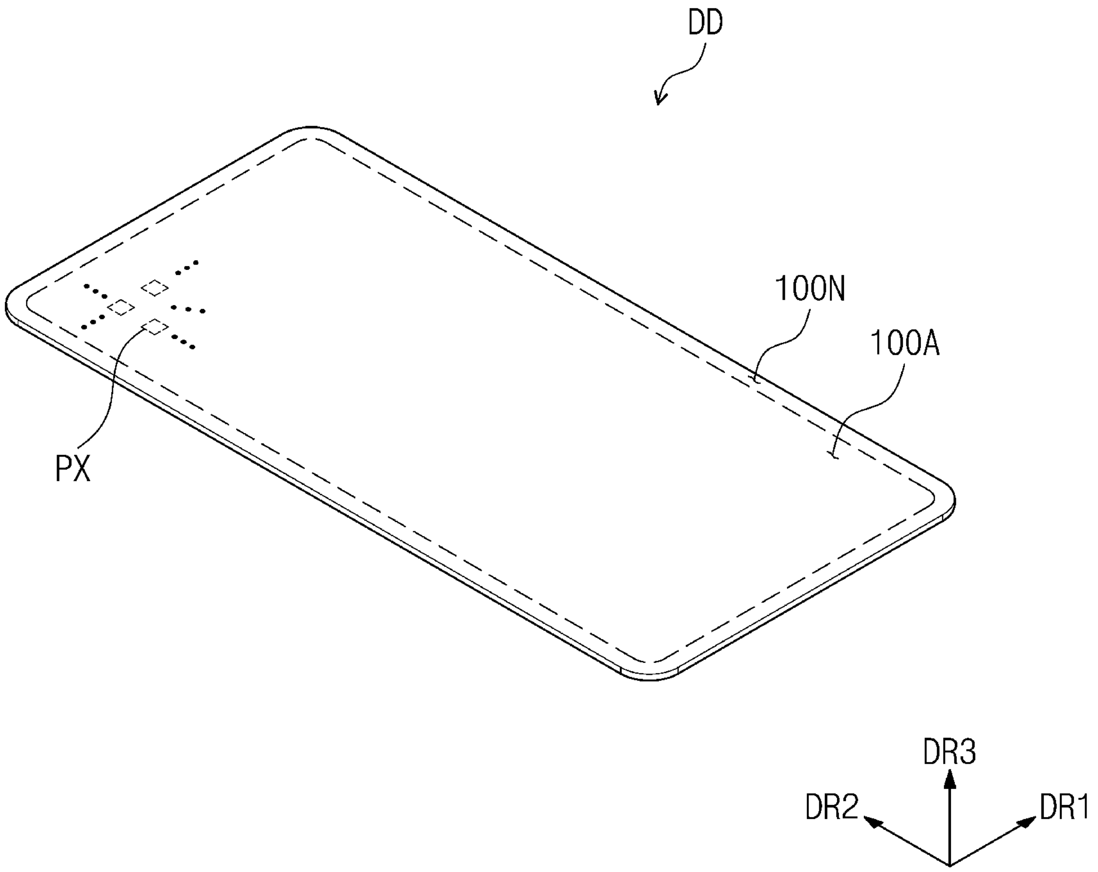
FIG. 1 is a schematic perspective view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

In this specification, it will be understood that when an element (or a region, a layer, a portion, or the like) is referred to as "being on", "connected to" or "coupled to" another element, it may be directly disposed on/connected/coupled to the other element, or intervening elements may be disposed therebetween. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Like reference numerals or symbols refer to like elements throughout. Also, in the drawings, the thickness, the ratio, and the dimension of the elements are exaggerated for effective description of the technical contents. The term "and/or" includes all combinations of one or more of the associated elements. For example, "A and/or B" may be understood to mean "A, B, or A and B." The terms "and" and "or" may be used in the conjunctive or disjunctive sense and may be understood to be equivalent to "and/or."

It will be understood that, although the terms "first," "second," etc. may be used herein to describe various elements, these elements should not be limited by these terms. These terms are only used to distinguish one element from another element. For example, a first element may be referred to as a second element, and similarly, a second element may also be referred to as a first element without departing from the scope of the disclosure. The singular forms are intended to include the plural forms, unless the context clearly indicates otherwise.

Additionally, the terms such as "below", "lower", "above", "upper", "over", "side", and the like may be used herein to describe the relationship of the elements illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

It will be understood that the term "includes" or "comprises", when used in this specification, specifies the presence of stated features, integers, steps, operations, elements, components, or a combination thereof, but does not preclude the presence or addition of one or more other features, integers, steps, operations, elements, components, or combinations thereof. Moreover, the terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise specified, the illustrated embodiments are to be understood as providing example features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the drawings.

FIG. 1 is a schematic perspective view of a display device DD according to an embodiment.

The display device DD may generate an image and detect an external input. The display device DD may include a display region 100A and a peripheral region 100N (disposed adjacent to the display region 100A). Pixels PX may be disposed in the display region 100A. The pixels PX may include a first color pixel (hereinafter, first pixel), a second color pixel (hereinafter, second pixel), and a third color pixel (hereinafter, third pixel) which each generate light of different colors.

Images may be displayed in the display region 100A. The display region 100A may include a plane defined by a first direction DR1 and a second direction DR2 (intersecting the first direction DR1). However, a shape of the display region 100A is not limited thereto.

Figure 2:
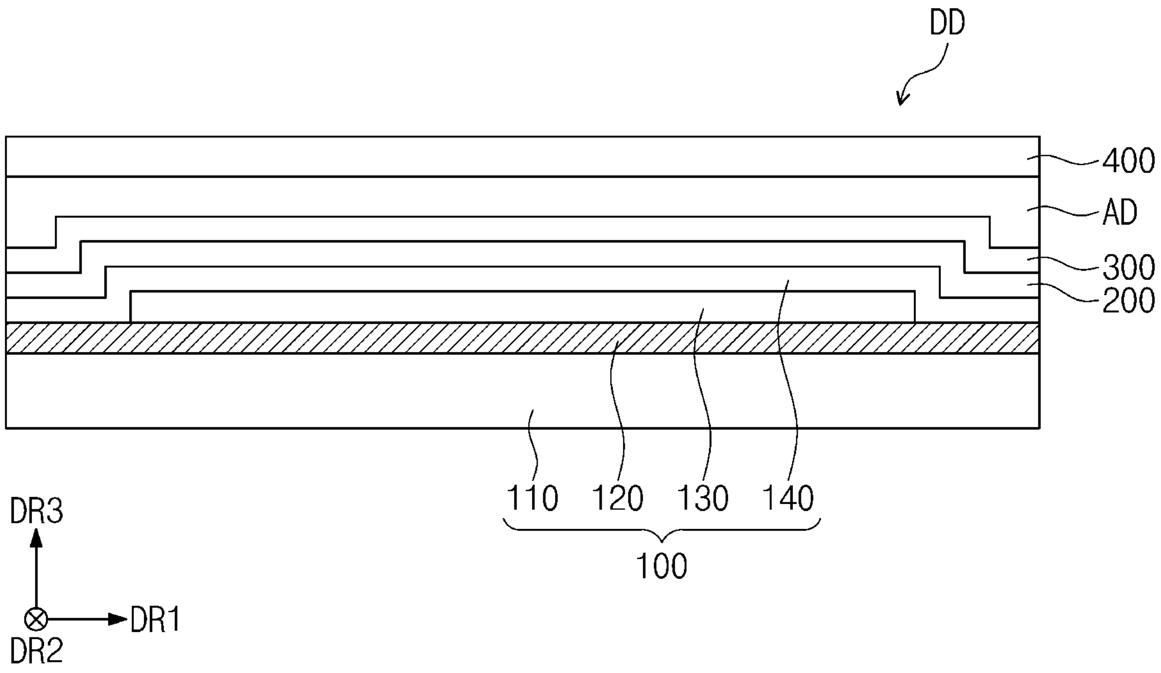
FIG. 2 is a schematic cross-sectional view of a display device according to an embodiment.

FIG. 2 is a schematic cross-sectional view of a display device DD according to an embodiment.

Referring to FIG. 2, the display device DD may include a display panel 100, an input sensor 200, an anti-reflector 300, and a window 400.

The display panel 100 may be a light-emitting display panel, for example, an organic light-emitting display panel, an inorganic light-emitting display panel, a micro-LED display panel, a nano-LED display panel, or the like. The display panel 100 may include a base layer 110, a driving element layer 120, a light-emitting element layer 130, and a thin-film encapsulation layer 140.

The base layer 110 may provide a base surface on which the driving element layer 120 is disposed. The base layer 110 may be a rigid substrate or a flexible substrate that is bendable, foldable, rollable, or the like. The base layer 110 may be a glass substrate, a metal substrate, a polymer substrate, or the like. However, the disclosure is not limited thereto, and the base layer 110 may include an inorganic layer, an organic layer, a composite material layer, the like, or a combination thereof.

The base layer 110 may have a multi-layered structure. For example, the base layer 110 may include a first synthetic resin layer, a multi- or single-layered inorganic layer, and a second synthetic resin layer disposed on the multi- or single-layered inorganic layer. The first and second synthetic resin layers may each include a polyimide-based resin, but the disclosure is not limited thereto.

The driving element layer 120 may be disposed on the base layer 110. The driving element layer 120 may include an insulating layer, a semiconductor pattern, a conductive pattern, and the like. The driving element layer 120 may include a driving circuit of the pixel PX illustrated in FIG. 1.

The light-emitting element layer 130 may be disposed on the driving element layer 120. The light-emitting element layer 130 may include a light-emitting element of the pixel PX illustrated in FIG. 1. For example, the light-emitting element may include an organic light-emitting material, an inorganic light-emitting material, an organic-inorganic light-emitting material, a quantum dot, a quantum rod, a micro LED, a nano LED, or the like.

The thin-film encapsulation layer 140 may be disposed on the light-emitting element layer 130. The thin-film encapsulation layer 140 may overlap a light-emitting region LA-R and a non-light-emitting region NLA (See e.g., FIG. 3A) in a plan view and cover a light-emitting element LD (e.g., a first light-emitting element). The thin-film encapsulation layer 140 may protect the light-emitting element layer 130 against foreign substances such as moisture, oxygen, dust particles, or the like. The thin-film encapsulation layer 140 may include at least one inorganic layer. For example, the thin-film encapsulation layer 140 may include a stacked structure of an inorganic layer/an organic layer/an inorganic layer.

The input sensor 200 may be disposed on the display panel 100. The input sensor 200 may detect an external input applied from an outside. The external input may be a user's input. The user's input may include various types of external inputs such as a part of a user's body, light, heat, a pen, pressure, and the like.

The input sensor 200 may be formed on the display panel 100 through a continuous process. The input sensor 200 may be disposed (e.g., directly disposed) on the display panel 100. In this specification, the term "a component B being directly disposed on a component A" may mean that another component is not disposed between the component A and the component B. For example, an adhesive layer may not be disposed between the input sensor 200 and the display panel 100.

The anti-reflector 300 may be disposed on the input sensor 200. The anti-reflector 300 may reduce an external light reflectance. The anti-reflector 300 may be disposed (e.g., directly disposed) on the input sensor 200 through a continuous process.

The anti-reflector 300 may include a light-blocking pattern overlapping a reflective structure disposed below the anti-reflector 300 in a plan view. The anti-reflector 300 may further include a color filter (CF, see, e.g., FIG. 4) overlapping a light-emitting region in a plan view, to be described below. The color filter may include a first-color color filter (hereinafter, first color filter CF-R, see, e.g., FIG. 4), a second-color color filter (hereinafter, second color filter CF-G, see, e.g., FIG. 4), and a third-color color filter (hereinafter, third color filter CF-B, see, e.g., FIG. 4) respectively corresponding to a first pixel, a second pixel, and a third pixel. The color filter may reduce an external light reflectance by absorbing light in a certain wavelength range among external light. The anti-reflector 300 will be described below in more detail.

The window 400 may be disposed over the anti-reflector 300. An adhesive layer AD may bond the window 400 and the anti-reflector 300. The adhesive layer AD may be a pressure sensitive adhesive film (PSA film), an optically clear adhesive film (OCA film), the like, or a combination thereof.

The window 400 may include at least one base layer. The base layer may be a glass substrate, a synthetic resin film, the like, or a combination thereof. The window 400 may have a multi-layered structure. The window 400 may include a thin-film glass substrate and a synthetic resin film disposed on the thin-film glass substrate. The adhesive layer AD may bond the thin-film glass substrate and the synthetic resin film, and the adhesive layer AD and the synthetic resin film may be separated from the thin-film glass substrate to be replaced with another adhesive layer AD and another synthetic resin film.

The window 400 may further include functional layers disposed on the base layer. The window 400 may further include a hard coating layer, an anti-scattering layer, an anti-fingerprint layer, the like, or a combination thereof.

In an embodiment, the adhesive layer AD may be omitted, and the window 400 may be disposed (e.g., directly disposed) on the anti-reflector 300. An organic material, an inorganic material, a ceramic material, the like, or a combination thereof may be coated on the anti-reflector 300.

Figure 3A:
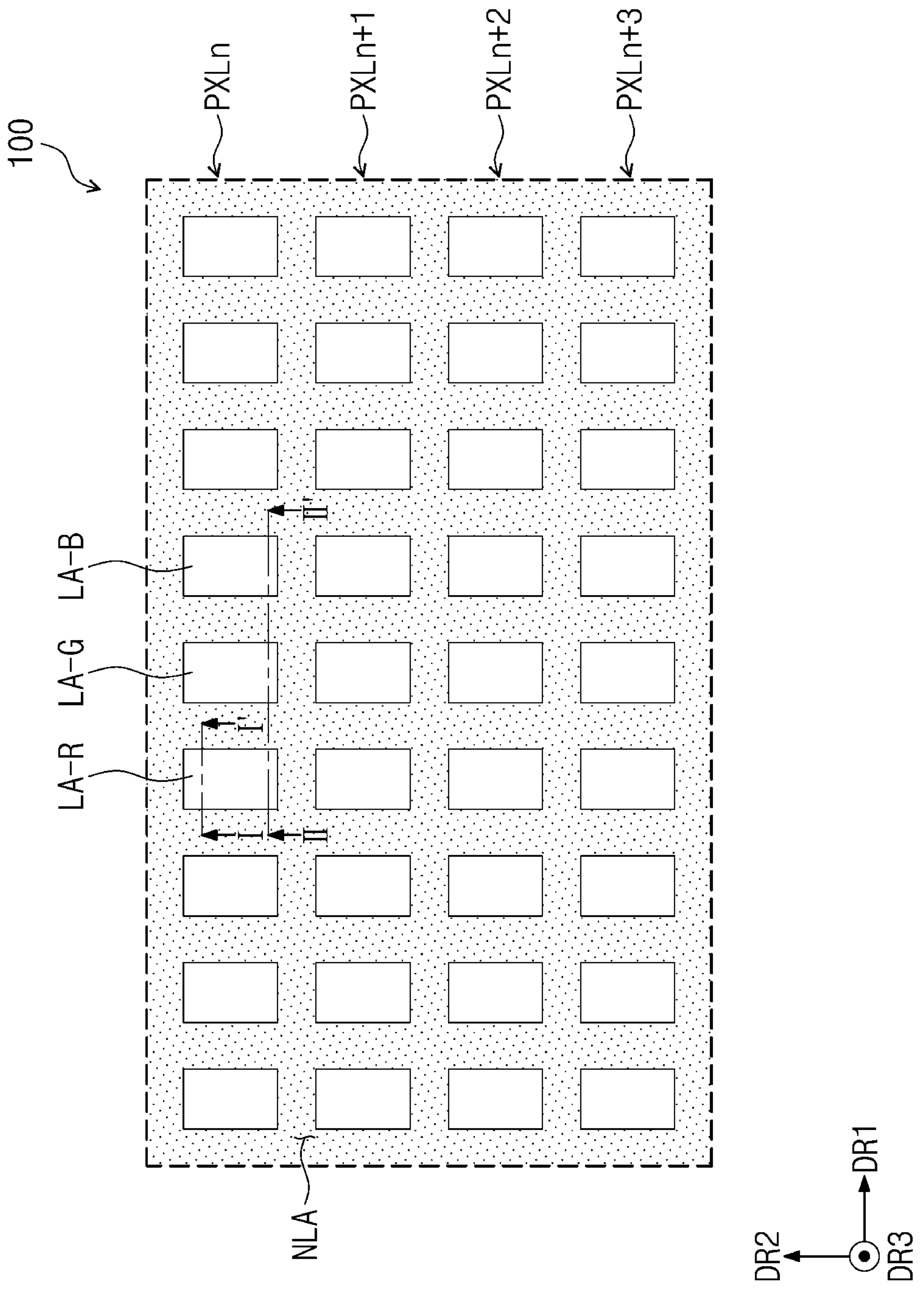
FIGS. 3A and 3B are schematic plan views of a display panel according to an embodiment.
Figure 3B:
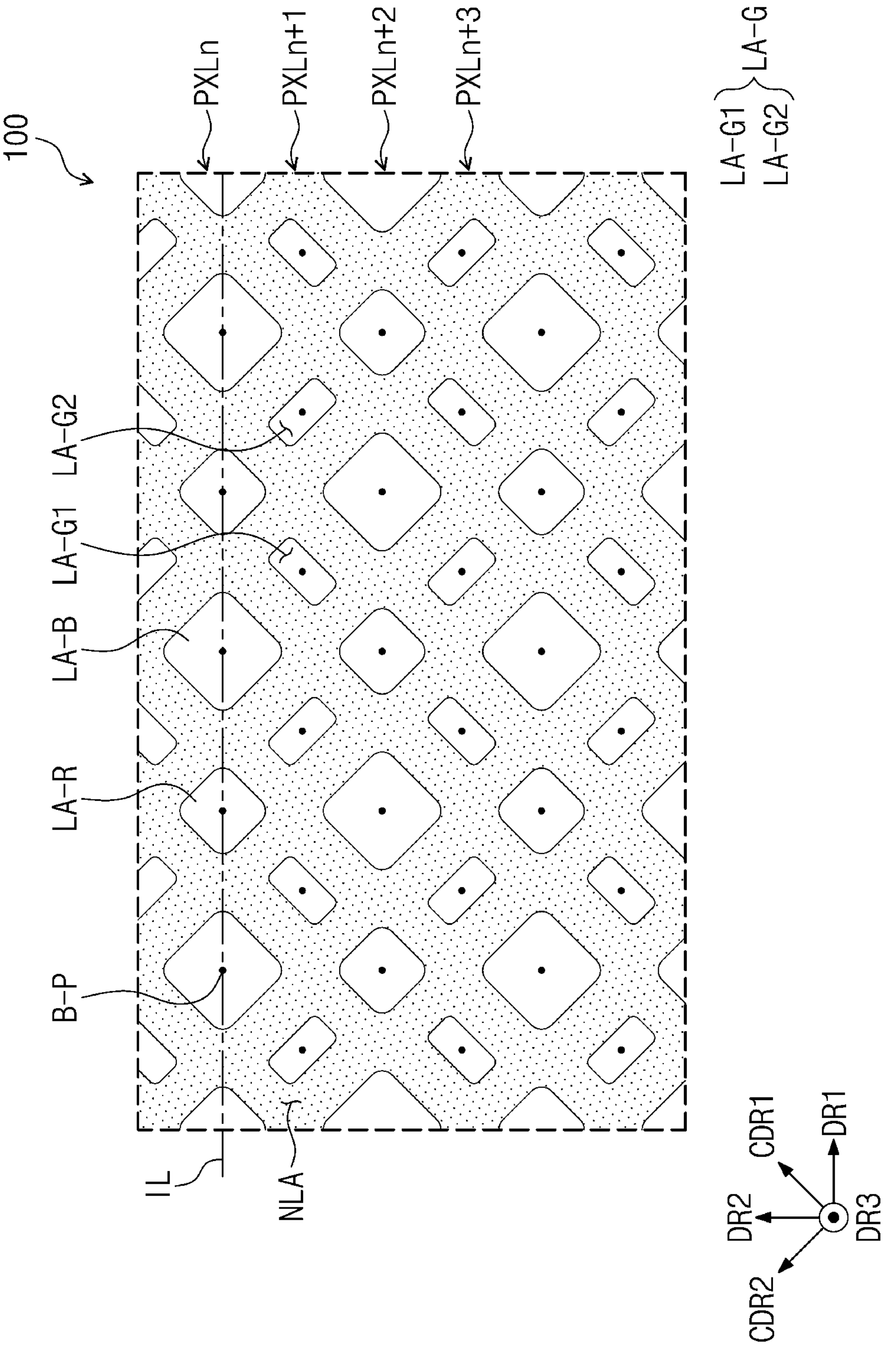

FIGS. 3A and 3B are schematic plan views of a display panel 100 according to an embodiment.

FIG. 3A schematically illustrates a portion of the display panel 100 corresponding to the display region 100A of FIG. 1. The display panel 100 may include a first light-emitting region LA-R, a second light-emitting region LA-G, and a third light-emitting region LA-B. The light-emitting element of the first pixel may be disposed in the first light-emitting region LA-R, the light-emitting element of the second pixel may be disposed in the second light-emitting region LA-G, and the light-emitting element of the third pixel may be disposed in the third light-emitting region LA-B. In an embodiment, the first light-emitting region LA-R may generate red light, the second light-emitting region LA-G may generate green light, and the third light-emitting region LA-B may generate blue light.

FIG. 3A illustrates that the first light-emitting region LA-R, the second light-emitting region LA-G, and the third light-emitting region LA-B have a same area in a plan view, but the disclosure is not limited thereto. The light-emitting regions LA-R, LA-G, and LA-B and an opening PDL-OP (see, e.g., FIG. 4) formed in a pixel defining layer PDL (see, e.g., FIG. 4) may have a same shape. A non-light-emitting region NLA may be disposed between the first light-emitting region LA-R, the second light-emitting region LA-G, and the third light-emitting region LA-B in a plan view.

The first light-emitting region LA-R, the second light-emitting region LA-G, and the third light-emitting region LA-B may constitute a unit light-emitting region, and unit light-emitting regions may be arranged in a matrix form. An arrangement of the first light-emitting region LA-R, the second light-emitting region LA-G, and the third light-emitting region LA-B which are illustrated in FIG. 3A may be a stripe-like arrangement.

The multiple light-emitting regions LA-B, LA-R, and LA-G may be arranged in multiple pixel rows extending in the first direction DR1. The pixel rows may be arranged in the second direction DR2. The pixel rows may include a (n)-th pixel row PXLn (n is a natural number), a (n+1)-th pixel row PXLn+1, a (n+2)-th pixel row PXLn+2, and a (n+3)-th pixel row PXLn+3.

Referring to FIG. 3B, the first light-emitting region LA-R, the second light-emitting region LA-G, and the third light-emitting region LA-B may each have different areas in a plan view. The first light-emitting region LA-R, the second light-emitting region LA-G, and the third light-emitting region LA-B may each have a substantially polygonal shape or the like in a plan view. The term "substantially polygonal shape" may include a polygon in terms of mathematics, a polygon having rounded vertices, a polygon of which vertices are blunt (not sharp), or the like. Shapes of the vertices may vary according to etching properties of the pixel defining layer PDL.

In an embodiment, the first light-emitting region LA-R and the third light-emitting region LA-B may have quadrilateral shapes symmetrical with respect to each of the first direction DR1 and the second direction DR2. In an embodiment, the second light-emitting region LA-G may have a quadrilateral shape asymmetrical with respect to each of the first direction DR1 and the second direction DR2. In an embodiment, the second light-emitting region LA-G may be symmetrical with respect to a first oblique direction CDR1 intersecting the first direction DR1 and the second direction DR2, and symmetrical with respect to a second oblique direction CDR2 perpendicular to (or intersecting) the first oblique direction CDR1.

The second light-emitting region LA-G may include a first type-second light-emitting region LA-G1 (hereinafter, first type-light-emitting region) and a second type-second light-emitting region LA-G2 (hereinafter, second type-light-emitting region) which are symmetrical with respect to the second direction DR2. In an embodiment, the second light-emitting region LA-G may include one of the first type-light-emitting region LA-G1 and the second type-light-emitting region LA-G2. In an embodiment, the second light-emitting region LA-G may be symmetrical with respect to each of the first direction DR1 and the second direction DR2.

In an embodiment, the first light-emitting region LA-R and the third light-emitting region LA-B may have substantially square shapes symmetrical with respect to each of the first direction DR1 and the second direction DR2 in a plan view. In an embodiment, the second light-emitting region LA-G may have a substantially rectangular shape in a plan view. The first type-light-emitting region LA-G1 and the second type-light-emitting region LA-G2 may have substantially rectangular shapes symmetrical with respect to the second direction DR2 in a plan view.

Referring to FIG. 3B, the (n)-th pixel row PXLn may include the first light-emitting regions LA-R and the third light-emitting regions LA-B alternately arranged in the first direction DR1. The (n+2)-th pixel row PXLn+2 may include the third light-emitting regions LA-B and the first light-emitting regions LA-R alternately arranged in the first direction DR1. The first light-emitting regions LA-R and the third light-emitting regions LA-B may be arranged in the second direction DR2.

An arrangement order of the light-emitting regions in the (n)-th pixel row PXLn and an arrangement order of the light-emitting regions in the (n+2)-th pixel row PXLn+2 may be different. The third light-emitting regions LA-B and the first light-emitting regions LA-R in the (n)-th pixel row PXLn and the third light-emitting regions LA-B and the first light-emitting regions LA-R in the (n+2)-th pixel row PXLn+2 may be alternately arranged. The light-emitting regions in the (n)-th pixel row PXLn may be shifted in the second direction DR2 by one light-emitting region, compared to the light-emitting regions in the (n+2)-th pixel row PXLn+2.

The second light-emitting regions LA-G may be arranged in each of the (n+1)-th pixel row PXLn+1 and the (n+3)-th pixel row PXLn+3. The (n+1)-th pixel row PXLn+1 may include the second type-light-emitting regions LA-G2 and the first type-light-emitting regions LA-G1 which are alternately disposed in the first direction DR1. The (n+3)-th pixel row PXLn+3 may include the first type-light-emitting regions LA-G1 and the second type-light-emitting regions LA-G2 which are alternately disposed in the first direction DR1.

The light-emitting regions LA-R and LA-B in the (n)-th pixel row PXLn and the light-emitting regions LA-G2 and LA-G1 in the (n+1)-th pixel row PXLn+1 may be alternately arranged. The light-emitting regions LA-B and LA-R in the (n+2)-th pixel row PXLn+2 and the light-emitting regions LA-G1 and LA-G2 in the (n+3)-th pixel row PXLn+3 may be alternately arranged. Center points B-P of the light-emitting regions LA-R, LA-G1, LA-G2, and LA-B arranged in each of the four pixel rows PXLn, PXLn+1, PXLn+2, and PXLn+3 may be linearly arranged on an imaginary line IL.

The arrangement of the light-emitting regions LA-R, LA-G, and LA-B may be as described above, and four second light-emitting regions LA-G may surround one first light-emitting region LA-R. Two second light-emitting regions LA-G (for example, two first type-light-emitting regions LA-G1) may face each other in the first oblique direction CDR1 with the first light-emitting region LA-R between the two second light-emitting regions LA-G, and other two second light-emitting regions LA-G (for example, two second type-light-emitting regions LA-G2) may face each other in the second oblique direction CDR2 with the first light-emitting region LA-R between the other two second light-emitting regions LA-G. Also, four second light-emitting regions LA-G may surround one third light-emitting region LA-B. Two second light-emitting regions LA-G (for example, two second type-light-emitting regions LA-G2) may face each other in the first oblique direction CDR1 with the third light-emitting region LA-B between the two second light-emitting regions LA-G, and other two second light-emitting regions LA-G (for example, two first type-light-emitting regions LA-G1) may face each other in the second oblique direction CDR2 with the third light-emitting region LA-B between the other two second light-emitting regions LA-G. The arrangement of the first light-emitting region LA-R, the second light-emitting region LA-G, and the third light-emitting region LA-B, illustrated in FIG. 3B, may be arranged in a diamond-like shape in a plan view.

Figure 4:
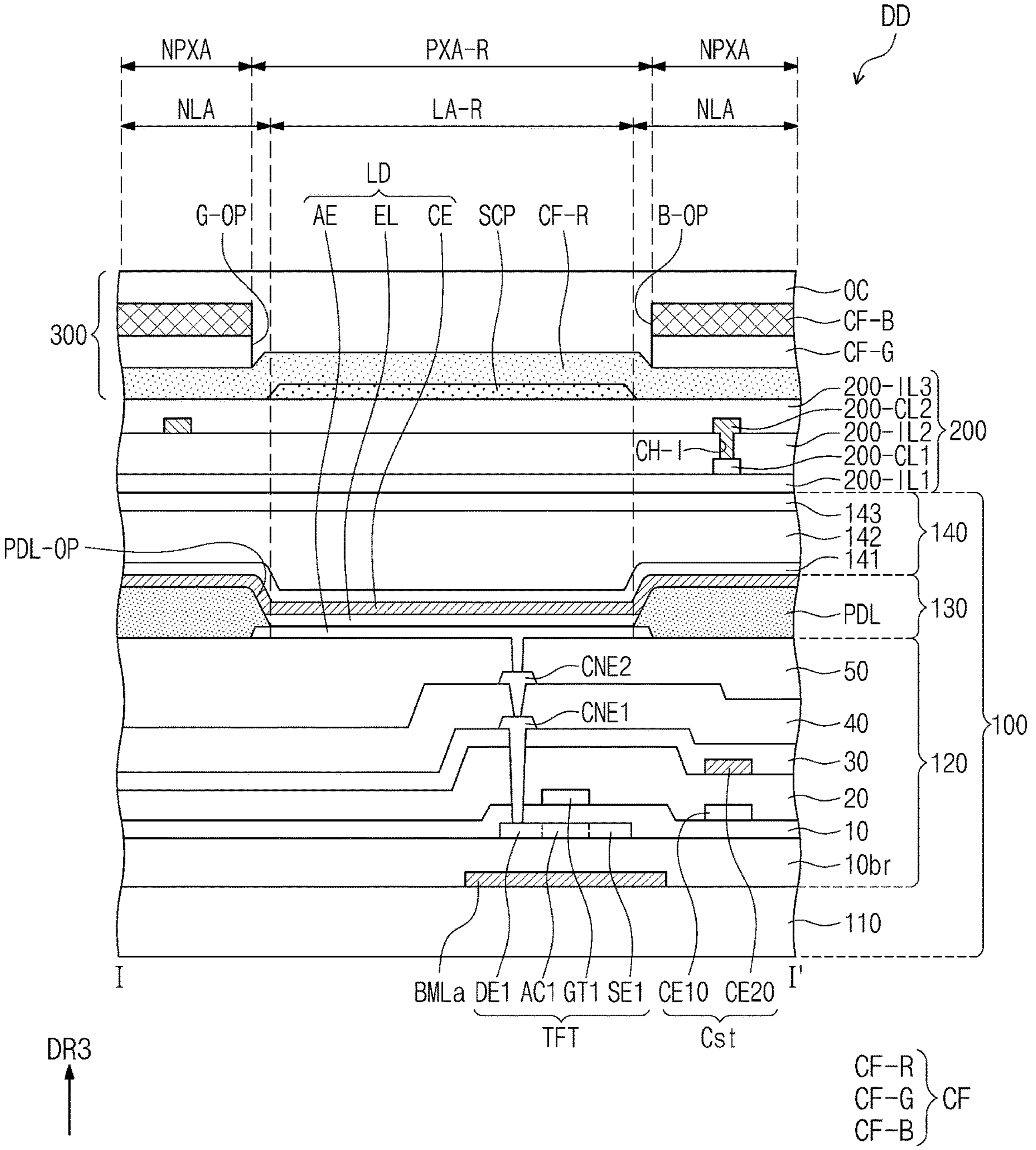
FIG. 4 is a schematic cross-sectional view of a display device taken along line I-I' of FIG. 3A according to an embodiment.
Figure 5:
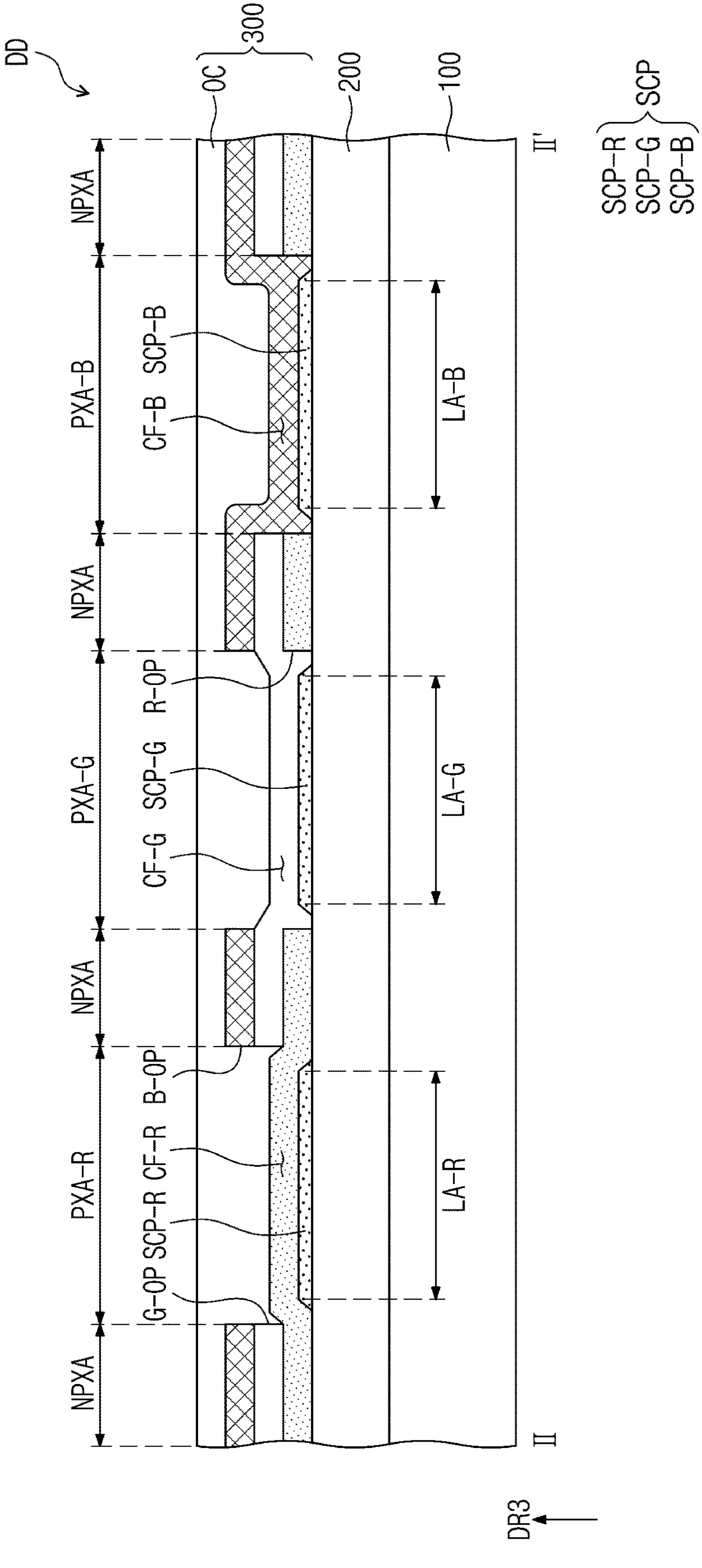
FIG. 5 is a schematic cross-sectional view of a display device taken along line II-II' of FIG. 3A according to an embodiment.

FIG. 4 is a schematic cross-sectional view of a display device DD taken along line I-I' of FIG. 3A according to an embodiment. FIG. 5 is a schematic cross-sectional view of a display device DD taken along line II-II' of FIG. 3A according to an embodiment.

FIG. 4 schematically illustrates a cross section corresponding to a first light-emitting region LA-R and a non-light-emitting region NLA adjacent to the first light-emitting region LA-R. FIG. 4 schematically illustrates a light-emitting element LD and a transistor TFT connected to the light-emitting element LD. The transistor may be one of multiple transistors included in the driving circuit of the pixel PX. In an embodiment, the transistor TFT may be a silicon transistor, but the disclosure is not limited thereto, and the transistor TFT may be a metal oxide transistor or the like.

A buffer layer **10*br* may be disposed on a base layer 110. The buffer layer 10*br* may prevent metal atoms or impurities from being diffused from the base layer 110 to a semiconductor pattern above (or on) the buffer layer 10*br***. The semiconductor pattern may include an active region AC1 of the transistor TFT.

A back metal layer BMLa may be disposed below (or under) the transistor TFT. The back metal layer BMLa may block external light from reaching the transistor TFT. The back metal layer BMLa may be disposed between the base layer 110 and the buffer layer **10*br*. In an embodiment, an inorganic barrier layer may be further disposed between the back metal layer BMLa and the buffer layer 10*br***. The back metal layer BMLa may be connected to electrodes or wires, and receive a constant voltage or a signal from the electrodes or the wires.

The semiconductor pattern may be disposed on the buffer layer **10*br***. The semiconductor pattern may include a silicon semiconductor. For example, the silicon semiconductor may include amorphous silicon, polycrystalline silicon, the like, or a combination thereof. For example, the semiconductor pattern may include low-temperature polysilicon.

The semiconductor pattern may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be an undoped region or may be a doped region doped with a dopant having a lower concentration than a concentration of the first region.

The first region may have higher conductivity than the second region, and substantially serve as an electrode or a signal line. The second region may substantially correspond to an active region (or channel) of a transistor. For example, a portion of the semiconductor pattern may be an active region of the transistor, another portion may be a source or drain (or a source or drain region) of the transistor, and another portion may be a connection electrode or connection signal line.

A source region SE1 (or source), an active region AC1 (or channel), and a drain region DE1 (or drain) of the transistor TFT may be formed from a semiconductor pattern. In a cross-sectional view, the source region SE1 and the drain region DE1 may each extend in opposite directions from the active region AC1.

A first insulating layer 10 may be disposed on the buffer layer 10*br*. The first insulating layer 10 may overlap the pixels PX (see, e.g., FIG. 1) in common in a plan view, and cover the semiconductor pattern. The first insulating layer 10 may include an inorganic layer and/or an organic layer, and may have a single- or multi-layered structure. The inorganic layer may include at least one of aluminum oxide, titanium oxide, silicon oxide, silicon nitride, silicon oxynitride, zirconium oxide, and hafnium oxide. In an embodiment, the first insulating layer 10 may be a single-layered silicon oxide layer. Not only the first insulating layer 10 but also an insulating layer of a driving element layer 120 to be described below may be an inorganic layer and/or an organic layer, and may have a single- or multi-layered structure. The inorganic layer may include at least one of the materials described above, but the disclosure is not limited thereto.

A gate GT1 (or gate region) of the transistor TFT may be disposed on the first insulating layer 10. The gate GT1 may be a portion of a metal pattern. The gate GT1 may overlap the active region AC1 in a plan view. In a process of doping the semiconductor pattern, the gate GT1 may function as a mask. The gate GT1 may include titanium (Ti), silver (Ag), an Ag-containing alloy, molybdenum (Mo), a Mo-containing alloy, aluminum (Al), an Al-containing alloy, aluminum nitride (AlN), tungsten (W), tungsten nitride (WN), copper (Cu), indium tin oxide (ITO), indium zinc oxide (IZO), the like, or a combination thereof, but the disclosure is not limited thereto.

A second insulating layer 20 may be disposed on the first insulating layer 10 and cover the gate GT1. A third insulating layer 30 may be disposed on the second insulating layer 20. A first electrode CE10 of the storage capacitor Cst may be disposed between the first insulating layer 10 and the second insulating layer 20. Also, a second electrode CE20 of a storage capacitor Cst may be disposed between the second insulating layer 20 and the third insulating layer 30.

A first connection electrode CNE1 may be disposed on the third insulating layer 30. The first connection electrode CNE1 may be connected to the drain region DE1 of the transistor TFT via a contact hole that passes through the first to the third insulating layers 10, 20, and 30.

A fourth insulating layer 40 may be disposed on the third insulating layer 30. A second connection electrode CNE2 may be disposed on the fourth insulating layer 40. The second connection electrode CNE2 may be connected to the first connection electrode CNE1 via a contact hole that passes through the fourth insulating layer 40. A fifth insulating layer 50 may be disposed on the fourth insulating layer 40 and cover the second connection electrode CNE2. FIG. 4 illustrates a stacked structure of the first insulating layer 10 to the fifth insulating layer 50, but the disclosure is not limited thereto, and an additional conductive layer and an additional insulating layer may be further disposed (in addition to the first insulating layer 10 to the fifth insulating layer 50).

The fourth insulating layer 40 and the fifth insulating layer 50 may each be an organic layer. For example, the organic layer may include a general-purpose polymer such as benzocyclobutene (BCB), polyimide, hexamethyldisiloxane (HMDSO), polymethylmethacrylate (PMMA), polystyrene (PS), or the like, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, the like, or blends thereof.

The light-emitting element LD may include a first electrode AE (or pixel electrode), a light-emitting structure EL, and a second electrode CE (or common electrode). The first electrode AE may be disposed on the fifth insulating layer 50. The first electrode AE may be a transmissive electrode, semi transmissive electrode, a reflective electrode, the like, or a combination thereof. The first electrode AE may include a reflective layer formed from silver (Ag), magnesium (Mg), aluminum (Al), platinum (Pt), palladium (Pd), gold (Au), nickel (Ni), neodymium (Nd), iridium (Jr), chromium (Cr), the like, or a compound thereof and a transparent electrode layer or translucent electrode layer formed on the reflective layer. The transparent electrode layer or translucent electrode layer may be provided with at least one selected from the group containing of indium tin oxide (ITO), indium zinc oxide (IZO), indium gallium zinc oxide (IGZO), zinc oxide (ZnO) or indium oxide ($In_2O_3$), and aluminum-doped zinc oxide (AZO). For example, the first electrode AE may include the stacked structure of ITO/Ag/ITO.

The pixel defining layer PDL may be disposed on the fifth insulating layer 50. According to an embodiment, the pixel defining layer PDL may have a light absorption property, for example, the pixel defining layer PDL may have a black color. The pixel defining layer PDL may include a black coloring agent. The black coloring agent may include a black pigment or a black dye. The black coloring agent may include carbon black, a metal such as chromium, the like, or an oxide thereof. The pixel defining layer PDL may correspond to a light-blocking pattern having a light-blocking property.

The pixel defining layer PDL may cover a portion of the first electrode AE. For example, an opening PDL-OP exposing a portion of the first electrode AE may be defined in the pixel defining layer PDL. The first light-emitting region LA-R may be defined by the opening PDL-OP of the pixel defining layer PDL.

The pixel defining layer PDL may increase a distance between an edge of the first electrode AE and the second electrode CE. Accordingly, the pixel defining layer PDL may prevent an arc at the edge of the first electrode AE.

The light-emitting structure EL may include at least a light-emitting pattern. The light-emitting structure EL may further include a hole control pattern disposed between the first electrode AE and the light-emitting pattern. The hole control pattern may include a hole transport layer and a hole injection layer. The light-emitting structure EL may further include an electron control pattern disposed between the light-emitting pattern and the second electrode CE. The electron control pattern may include an electron transport layer, and further include an electron injection layer.

The light-emitting structure EL, for example, at least one of the light-emitting pattern, the hole control pattern, and the electron control pattern may be formed through an inkjet process. A pattern formed through the inkjet process may be disposed inside the opening PDL-OP. Accordingly, the second electrode CE may contact an upper surface of the pixel defining layer PDL.

The thin-film encapsulation layer 140 may be disposed on the light-emitting element layer 130. The thin-film encapsulation layer 140 may include a first inorganic encapsulation layer 141, an organic encapsulation layer 142, and a second inorganic encapsulation layer 143 which are sequentially stacked, but a stacked structure of the thin-film encapsulation layer 140 is not limited thereto. The first inorganic encapsulation layer 141, the organic encapsulation layer 142, and the second inorganic encapsulation layer 143 may each have a single- or multi-layered structure.

The first and the second inorganic encapsulation layers 141 and 143 may protect the light-emitting element layer 130 against moisture and/or oxygen, and the organic encapsulation layer 142 may protect the light-emitting element layer 130 against foreign substances such as dust particles or the like. The first and the second inorganic encapsulation layers 141 and 143 may include a silicon nitride layer, a silicon oxynitride layer, a silicon oxide layer, a titanium oxide layer, an aluminum oxide layer, the like, or a combination thereof. The organic encapsulation layer 142 may include an acrylic organic layer, but the disclosure is not limited thereto.

Table 1 below shows a stacked structure of the first and the second inorganic encapsulation layers 141 and 143 in more detail.

TABLE 1

| Layer | Material | Refractive index |
|---|---|---|
| Second inorganic encapsulation layer | $SiN_x$ | About 1.89 |
| (1-4)-th inorganic encapsulation layer | SiON | About 1.53 |
| (1-3)-th inorganic encapsulation layer | SiON | About 1.57 |
| (1-2)-th inorganic encapsulation layer | SiON | About 1.62 |
| (1-1)-th inorganic encapsulation layer | $SiN_x$ | About 1.89 |

The first inorganic encapsulation layer 141 may include a (1-1)-th inorganic encapsulation layer, a (1-2)-th inorganic encapsulation layer, a (1-3)-th inorganic encapsulation layer, and a (1-4)-th inorganic encapsulation layer which are sequentially stacked. The (1-1)-th inorganic encapsulation layer disposed on the lowermost side may have a greater refractive index than the (1-2)-th inorganic encapsulation layer, the (1-3)-th inorganic encapsulation layer, and the (1-4)-th inorganic encapsulation layer. Referring to the refractive indices of the (1-2)-th inorganic encapsulation layer, the (1-3)-th inorganic encapsulation layer, and the (1-4)-th inorganic encapsulation layer, the refractive index of the inorganic encapsulation layer may become smaller toward an upper side. Silicon oxynitride may have a lower refractive index as an oxygen composition ratio is higher, and the (1-2)-th inorganic encapsulation layer, the (1-3)-th inorganic encapsulation layer, and the (1-4)-th inorganic encapsulation layer may each have different oxygen composition ratios. Thus, an emission direction of light (hereinafter, source light) generated in the light-emitting element LD may be improved.

The source light may transmit toward an upper side after passing through the (1-1)-th inorganic encapsulation layer, the (1-2)-th inorganic encapsulation layer, the (1-3)-th inorganic encapsulation layer, and the (1-4)-th inorganic encapsulation layer. The organic encapsulation layer 142 may have a smaller refractive index than a refractive index of the (1-4)-th inorganic encapsulation layer. The organic encapsulation layer 142 may have a refractive index in a range of about 1.3 to about 1.4. Thus, the source light passing through the (1-4)-th inorganic encapsulation layer may transmit toward an upper side.

The (1-2)-th inorganic encapsulation layer, the (1-3)-th inorganic encapsulation layer, and the (1-4)-th inorganic encapsulation layer may have smaller refractive indices than a refractive index of the second inorganic encapsulation layer 143. The source light may be recycled between the (1-1)-th inorganic encapsulation layer and the second inorganic encapsulation layer 143. A large amount of the recycled light may be emitted to an outside. Thus, emission efficiency of the source light may be improved.

The input sensor 200 may detect an external input applied from the outside. The external input may include various types of inputs such as a part of a user's body, light, heat, a pen, pressure, and the like.

The input sensor 200 may be formed on the display panel 100 through a continuous process. The input sensor 200 may be disposed (e.g., directly disposed) on the display panel 100. In this specification, the term "a component B being directly disposed on a component A" may mean that another component is not disposed between the component A and the component B. For example, an adhesive layer may not be disposed between the input sensor 200 and the display panel 100.

The input sensor 200 may include a first insulating layer 200-IL1, a first conductive pattern layer 200-CL1, a second insulating layer 200-IL2, a second conductive pattern layer 200-CL2, and a third insulating layer 200-IL3.

In an embodiment, the first insulating layer 200-IL1 and/or the third insulating layer 200-IL3 may be omitted. In case that the first insulating layer 200-IL1 is omitted, the first conductive pattern layer 200-CL1 may be disposed (e.g., directly disposed) on the uppermost insulating layer (for example, the second inorganic insulating layer 143) of the thin-film encapsulation layer 140. The third insulating layer 200-IL3 may be substituted with an adhesive layer or an insulating layer of the anti-reflector 300 disposed on the input sensor 200. In an embodiment, the input sensor 200 may include only one of the first conductive pattern layer 200-CL1 and the second conductive pattern layer 200-CL2. In an embodiment, the input sensor 200 may be omitted.

The input sensor 200 may include first sensing electrodes and second sensing electrodes intersecting each other. A bridge pattern may be disposed in a region where the first sensing electrodes and the second sensing electrodes intersect each other, and the bridge pattern may be formed from the first conductive pattern layer 200-CL1 of FIG. 4. Remaining portions of the first sensing electrodes and the second sensing electrodes except for the bridge pattern may be formed from the second conductive pattern layer 200-CL2 of FIG. 4. The bridge pattern may be connected to a conductive pattern of the second conductive pattern layer 200-CL2 via a contact hole CH-1 passing through the second insulating layer 200-IL2.

The conductive pattern of the first conductive pattern layer 200-CL1 and the conductive pattern of the second conductive pattern layer 200-CL2 may overlap the non-light-emitting region NLA in a plan view. Openings respectively corresponding to the light-emitting regions LA-R, LA-G, and LA-B of FIG. 3A may be defined in the first sensing electrodes and the second sensing electrodes. The openings of the first sensing electrodes and the second sensing electrodes may be greater in area than the opening PDL-OP of the pixel defining layer PDL.

The anti-reflector 300 may be disposed on the input sensor 200. The anti-reflector 300 may include a scattering pattern SCP, color filters CF, and an overcoat layer OC. In an embodiment, the scattering pattern SCP may be included in the anti-reflector 300, but the disclosure is not limited thereto. In another embodiment, the scattering pattern SCP may be a component separate from the anti-reflector 300.

The scattering pattern SCP may include a base resin and scattering particles mixed in the base resin. The base resin, which is a medium in which the scattering particles are dispersed, may be composed of various resin compositions that are generally referred to as binders. However, the disclosure is not limited thereto, and in this specification, a medium dispersing the scattering particles may be referred to as the base resin regardless of the name of the medium, additional functions, constituent materials, or the like. The base resin may be a polymer resin. For example, the base resin may be an acrylic resin, a urethane-based resin, a silicone-based resin, an epoxy-based resin, the like, or a combination thereof. The base resin may be a transparent resin.

The scattering particles may be titanium oxide ($TiO_2$) or silica-based nanoparticles or the like. The scattering pattern SCP may overlap the light-emitting element LD, for example, the first light-emitting region LA-R in a plan view, and may receive source light. The scattering particles may scatter incident source light. Thus, a phenomenon that the source light is transmitted more in a specific viewing angle and/or an azimuthal angle may be reduced or suppressed. As the source light is scattered, a viewing angle may be widened.

In a plan view, the scattering pattern SCP may have a shape corresponding to a shape of the light-emitting region LA-R, LA-G, and LA-B. For example, the scattering pattern SCP may fully overlap the first light-emitting region LA-R in a plan view.

The first color filter CF-R may overlap at least the first light-emitting region LA-R in a plan view. The first color filter CF-R may further overlap the non-light-emitting region NLA in a plan view. The first color filter CF-R may cover the scattering pattern SCP. The source light scattered by the scattering pattern SCP may be provided to an outside through the first color filter CF-R.

In an embodiment, the first color filter CF-R may contact the scattering pattern SCP. In an embodiment, another insulating layer, for example, an inorganic layer may be further disposed between the first color filter CF-R and the scattering pattern SCP.

The second color filter CF-G may be disposed on the first color filter CF-R and overlap the non-light-emitting region NLA in a plan view. The third color filter CF-B may be disposed on the second color filter CF-G and overlap the non-light-emitting region NLA in a plan view. A stacking order of the second color filter CF-G and the third color filter CF-B is not limited.

A region in which at least two color filters among the first color filter CF-R, the second color filter CF-G, and the third color filter CF-B overlap each other in a plan view may be a non-pixel region NPXA. The source light scattered by the scattering pattern SCP and incident onto the non-pixel region NPXA may be absorbed by the second color filter CF-G and the third color filter CF-B.

A region in which the second color filter CF-G and the third color filter CF-B do not overlap in a plan view, and the first color filter CF-R among the first color filter CF-R, the second color filter CF-G, and the third color filter CF-B overlaps in a plan view may be a first pixel region PXA-R. The first pixel region PXA-R may be a region in which the source light generated by the light-emitting element LD is provided to an outside.

The second color filter CF-G and the third color filter CF-B may not overlap the scattering pattern SCP in a plan view. Openings G-OP and B-OP corresponding to the first pixel region PXA-R may be defined respectively in the second color filter CF-G and the third color filter CF-B. FIG. 4 schematically illustrates that an edge of the second color filter CF-G and the edge of the third color filter CF-B which each define the openings G-OP and B-OP are aligned, but the disclosure is not limited thereto.

A region of the first color filter CF-R overlapping the scattering pattern SCP in a plan view may be relatively convex, compared to the other regions (or another region) of the first color filter CF-R. The relative convex region of the first color filter CF-R may reduce a step formed by the opening G-OP of the second color filter CF-G and the opening B-OP of the third color filter CF-B. Thus, an overcoat layer OC to be described below may provide a flat upper surface.

The overcoat layer OC may cover the third color filter CF-B and partially cover the first color filter CF-R inside the opening G-OP of the second color filter CF-G and the opening B-OP of the third color filter CF-B. The overcoat layer OC may remove a step created by patterned first color filter CF-R, second color filter CF-G, and third color filter CF-B and may provide a flat upper surface. The overcoat layer OC may include an organic material or the like.

In an embodiment, a light-blocking pattern may be further disposed. The light-blocking pattern may be disposed on the third insulating layer 200-IL3 or on the color filter CF. The light-blocking pattern is not limited as long as a material that absorbs light is included in the light-blocking pattern. The light-blocking pattern may be a layer having a black color, and in an embodiment, the light-blocking pattern may include a black coloring agent. The black coloring agent may include a black pigment or a black dye. The black coloring agent may include carbon black, a metal such as chromium (Cr) or the like, or an oxide thereof.

FIG. 5 schematically illustrates a display panel 100 and an input sensor 200. Referring to FIG. 5, a scattering pattern SCP may include a first scattering pattern SCP-R, a second scattering pattern SCP-G, and a third scattering pattern SCP-B which are disposed respectively corresponding to a first light-emitting region LA-R, a second light-emitting region LA-G, and a third light-emitting region LA-B. A first color filter CF-R may overlap the first scattering pattern SCP-R in the first light-emitting region LA-R, a second color filter CF-G may overlap the second scattering pattern SCP-G in the second light-emitting region LA-G, and a third color filter CF-B may overlap the third scattering pattern SCP-B in the third light-emitting region LA-B in a plan view. The second scattering pattern SCP-G may be disposed inside an opening R-OP of the first color filter CF-R, and the third scattering pattern SCP-B may be disposed inside another opening R-OP of the first color filter CF-R.

The first scattering pattern SCP-R, the second scattering pattern SCP-G, and the third scattering pattern SCP-B may be formed through a same process. A base resin into which the scattering particles are mixed may be coated, and a coating layer may be patterned through a photolithography process. The first scattering pattern SCP-R, the second scattering pattern SCP-G, and the third scattering pattern SCP-B which are formed through a same process may include substantially a same material. The first scattering pattern SCP-R, the second scattering pattern SCP-G, and the third scattering pattern SCP-B may include scattering particles having substantially a same composition ratio.

A first pixel region PXA-R, a second pixel region PXA-G, and a third pixel region PXA-B may be defined by the first color filter CF-R, the second color filter CF-G, and the third color filter CF-B. The overcoat layer OC may cover the first color filter CF-R in the first pixel region PXA-R, cover the second color filter CF-G in the second pixel region PXA-G, and cover the third color filter CF-B in the third pixel region PXA-B. The overcoat layer OC may cover the third color filter CF-B in the non-pixel region NPXA.

Although not illustrated, a stacked structure of the display panel 100 corresponding to each of the second light-emitting region LA-G and the third light-emitting region LA-B and the stacked structure of the display panel 100 corresponding to the first light-emitting region LA-R illustrated in FIG. 4 may be the same. The light-emitting element LD (see, e.g., FIG. 4) may include a first light-emitting element, a second light-emitting element, and a third light-emitting element. However, the first light-emitting element corresponding to the first light-emitting region LA-R, the second light-emitting element corresponding to the second light-emitting region LA-G, and the third light-emitting element corresponding to the third light-emitting region LA-B may include light-emitting patterns having different materials.

Figure 6:
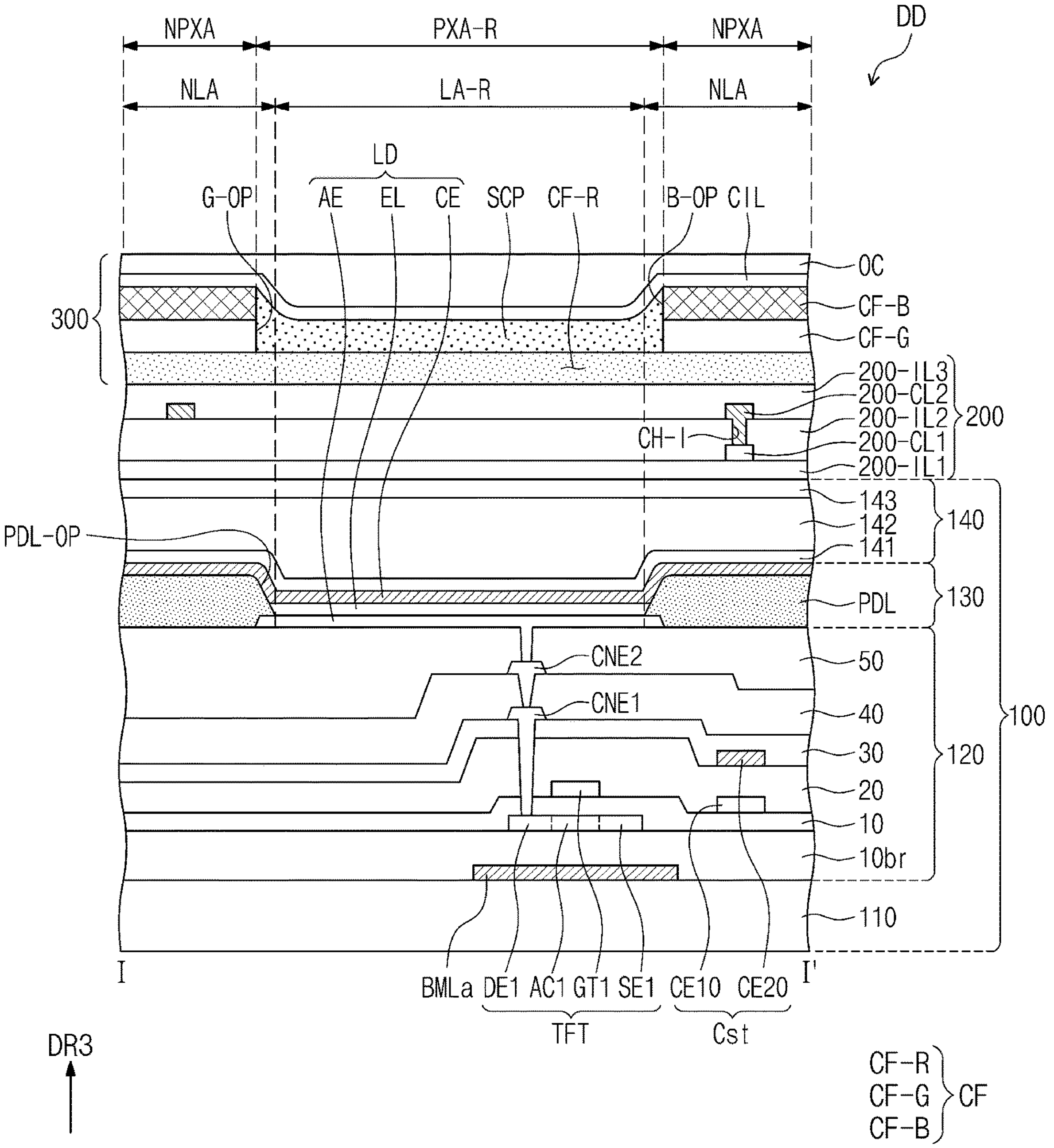
FIG. 6 is a schematic cross-sectional view of a display device taken along line I-I' of FIG. 3A according to an embodiment.
Figure 7:
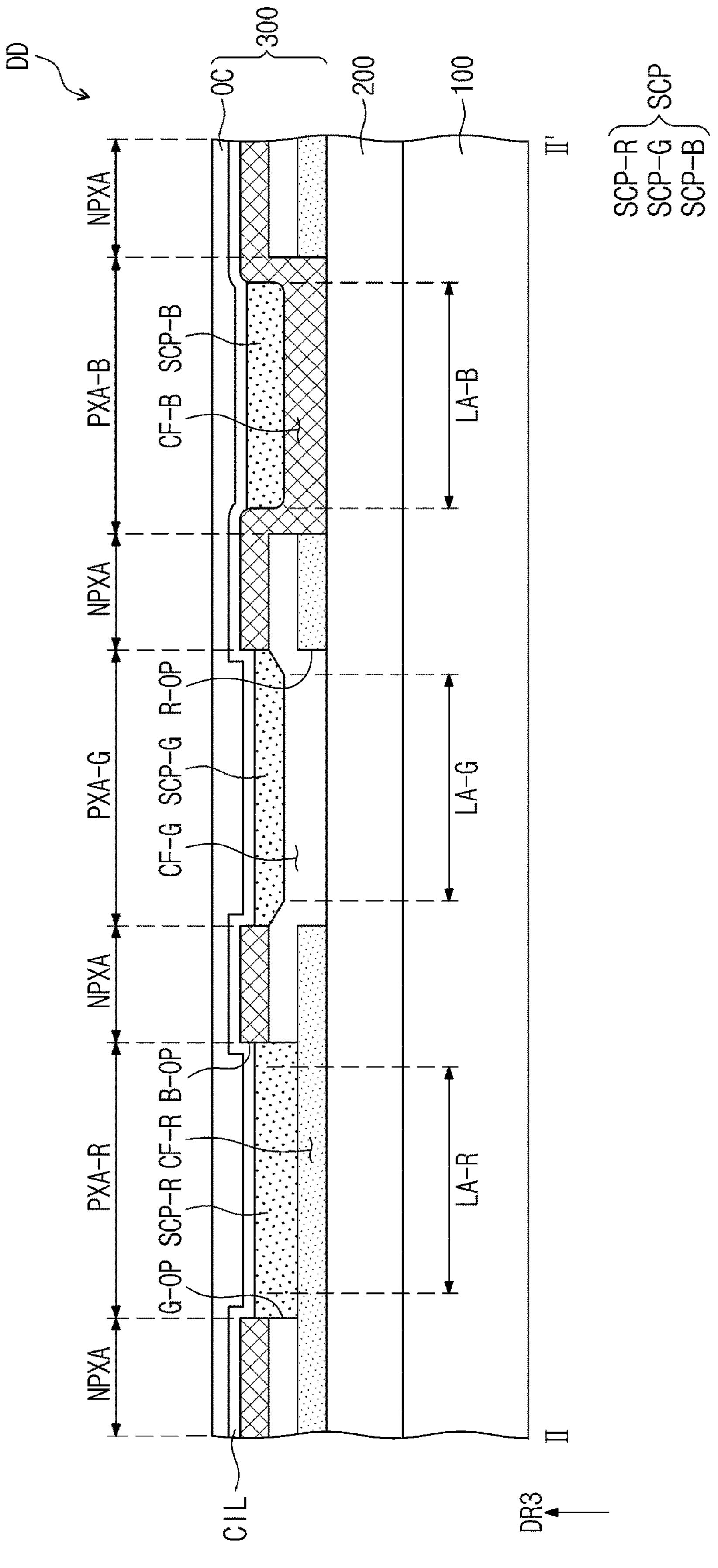
FIG. 7 is a schematic cross-sectional view of a display device taken along line II-II' of FIG. 3A according to an embodiment.

FIG. 6 is a schematic cross-sectional view of a display device DD taken along line I-I' of FIG. 3A according to an embodiment. FIG. 7 is a schematic cross-sectional view of a display device DD taken along line II-II' of FIG. 3A according to an embodiment.

Hereinafter, the detailed description of components same as or similar to the detailed description of components in FIGS. 4 and 5 will not be repeated.

Referring to FIG. 6, the first color filter CF-R may be disposed on the input sensor 200 and overlap the first light-emitting region LA-R in a plan view. The scattering pattern SCP may be disposed on the first color filter CF-R and overlap the first light-emitting region LA-R in a plan view.

The second color filter CF-G and the third color filter CF-B overlapping the non-pixel region NPXA in a plan view may be disposed on the first color filter CF-R. The scattering pattern SCP may be disposed inside the opening G-OP of the second color filter CF-G and the opening B-OP of the third color filter CF-B.

A well region may be defined by the opening G-OP of the second color filter CF-G and the opening B-OP of the third color filter CF-B. Scattering particles may be provided in the well region through an inkjet process. The scattering pattern SCP may be formed from the scattering particles through a curing process. A region adjacent to an inner wall of the second color filter CF-G defining the opening G-OP of the second color filter CF-G and a region adjacent to the inner wall of the third color filter CF-B defining the opening B-OP of the third color filter CF-B may be thicker than a central region of the scattering pattern SCP. Different thickness between the region and the central region of the scattering pattern SCP may be because a tension is generated between the liquid scattering composition and the inner walls of the second color filter CF-G and the third color filter CF-B. However, the disclosure is not limited thereto, and the scattering pattern SCP may be formed through a photolithography process.

The anti-reflector 300 may further include an inorganic layer CIL. The inorganic layer CIL may be disposed between the overcoat layer OC and the color filter CF and between the overcoat layer OC and the scattering pattern SCP. The inorganic layer CIL may cover the color filter CF and the scattering pattern SCP. The inorganic layer CIL may include silicon oxide, silicon nitride, silicon oxynitride, the like, or a combination thereof.

The inorganic layer CIL may have a refractive index in a range of about 1.6 to about 2.0. The inorganic layer CIL having a relatively higher refractive index may reduce reflection of external light.

Referring to FIG. 7, a first scattering pattern SCP-R may be disposed on a first color filter CF-R in a first light-emitting region LA-R, a second scattering pattern SCP-G may be disposed on a second color filter CF-G in a second light-emitting region LA-G, and a third scattering pattern SCP-B may be disposed on a third color filter CF-B in a third light-emitting region LA-B. The second scattering pattern SCP-G may be disposed inside an opening B-OP of the third color filter CF-B.

The third scattering pattern SCP-B may be disposed inside a recessed region formed in the third color filter CF-B. Since the third color filter CF-B is disposed inside the opening R-OP of the first color filter CF-R and the opening G-OP of the second color filter CF-G which are disposed below the third color filter CF-B, the recessed region may be formed in the third color filter CF-B.

The first scattering pattern SCP-R, the second scattering pattern SCP-G, and the third scattering pattern SCP-B may be formed through an inkjet process. The first scattering pattern SCP-R, the second scattering pattern SCP-G, and the third scattering pattern SCP-B may include scattering particles having substantially a same composition ratio.

The inorganic layer CIL may cover the first color filter CF-R in a first pixel region PXA-R, cover the second color filter CF-G in a second pixel region PXA-G, and cover the third color filter CF-B in a third pixel region PXA-B. The inorganic layer CIL may cover the third color filter CF-B in a non-pixel region NPXA.

According to the description above, a scattering pattern may scatter light generated in a display panel 100 (see, e.g., FIG. 3). Therefore, light generated in a display panel 100 may spread widely, so that a WAD phenomenon may be suppressed or reduced.

A step caused by a stacked structure of color filters CF may be compensated by a scattering pattern. For example, the step may be reduced.

As a thin-film encapsulation layer 140 has the stacked structure described above, light-emission efficiency may be improved.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display panel including:

a first light-emitting element disposed in a first light-emitting region; and a thin-film encapsulation layer disposed in the first light-emitting region and a non-light-emitting region adjacent to the first light-emitting region and covering the first light-emitting element;

a first scattering pattern disposed on the thin-film encapsulation layer and overlapping the first light-emitting element in a plan view;

a first color filter covering the first scattering pattern; and a second color filter disposed on the first color filter.

2. The display device of claim 1, wherein:

the second color filter disposed on the first color filter overlaps the first color filter in a plan view and does not overlap the first scattering pattern in a plan view; and the display device further comprises an overcoat layer covering the first color filter and the second color filter.

3. The display device of claim 2, further comprising:

a second scattering pattern disposed on the thin-film encapsulation layer, wherein the display panel further includes a second light-emitting element disposed in a second light-emitting region spaced apart from the first light-emitting region with the non-light-emitting region disposed between the first light-emitting region and the second light-emitting region, the second scattering pattern overlaps the second light-emitting element in a plan view, and the second color filter covers the second scattering pattern.

4. The display device of claim 3, wherein the first scattering pattern and the second scattering pattern include substantially a same material.

5. The display device of claim 1, wherein:

the second color filter includes an opening corresponding to the first scattering pattern; and the display device further comprises an overcoat layer covering the first color filter and the second color filter.

6. The display device of claim 1, wherein the display panel further includes a pixel defining layer having an opening, the first light-emitting element includes:

a first electrode exposed by the opening;

a light-emitting structure disposed on the first electrode; and a second electrode disposed on the light-emitting structure and contacting an upper surface of the pixel defining layer, and the light-emitting structure includes:

a hole control pattern;

a light-emitting pattern disposed on the hole control pattern; and an electron control pattern disposed on the light-emitting pattern.

7. The display device of claim 1, wherein the first color filter contacts the first scattering pattern.

8. The display device of claim 1, wherein the first scattering pattern includes a base resin and scattering particles mixed in the base resin.

9. The display device of claim 1, wherein the thin-film encapsulation layer includes:

a first inorganic encapsulation layer;

an organic encapsulation layer disposed on the first inorganic encapsulation layer; and a second inorganic encapsulation layer disposed on the organic encapsulation layer, the first inorganic encapsulation layer includes a plurality of inorganic layers, and a refractive index of one of the plurality of inorganic layers disposed on a lowermost layer is less than refractive indices of one of the plurality of inorganic layers disposed in the lowermost layer and the second inorganic encapsulation layer.

10. The display device of claim 1, further comprising:

an input sensor disposed between the thin-film encapsulation layer and the first scattering pattern.

11. A display device comprising:

a display panel including:

a first light-emitting element disposed in a first light-emitting region; and a thin-film encapsulation layer disposed in the first light-emitting region and a non-light-emitting region adjacent to the first light-emitting region and covering the first light-emitting element;

a first color filter disposed on the thin-film encapsulation layer and overlapping the first light-emitting element in a plan view;

a second color filter disposed on the first color filter and including an opening corresponding to the first light-emitting element; and a first scattering pattern disposed in the opening of the second color filter.

12. The display device of claim 11, further comprising:

an inorganic layer disposed on the second color filter and the first scattering pattern.

13. The display device of claim 12, wherein the inorganic layer has a refractive index in a range of about 1.6 to about 2.0.

14. The display device of claim 12, further comprising:

an overcoat layer covering the inorganic layer.

15. The display device of claim 12, further comprising:

a second scattering pattern, wherein the display panel further includes:

a second light-emitting element disposed in a second light-emitting region spaced apart from the first light-emitting region with the non-light-emitting region disposed between the first light-emitting region and the second light-emitting region in a plan view; and a third color filter disposed on the second color filter and including an opening corresponding to the second light-emitting element, the second color filter overlaps the second light-emitting element in a plan view, and the second scattering pattern is disposed in the opening of the third color filter.

16. The display device of claim 15, wherein the first scattering pattern and the second scattering pattern include substantially a same material.

17. The display device of claim 11, wherein the display panel further includes a pixel defining layer having an opening, the first light-emitting element includes:

a first electrode exposed by the opening of the pixel defining layer;

a light-emitting structure disposed on the first electrode; and a second electrode disposed on the light-emitting structure and contacting an upper surface of the pixel defining layer, and the light-emitting structure includes:

a hole control pattern;

a light-emitting pattern disposed on the hole control pattern; and an electron control pattern disposed on the light-emitting pattern.

18. The display device of claim 11, wherein the first color filter contacts the first scattering pattern.

19. The display device of claim 11, wherein the first scattering pattern includes a base resin and scattering particles mixed in the base resin.

20. The display device of claim 11, wherein the thin-film encapsulation layer includes:

a first inorganic encapsulation layer;

an organic encapsulation layer disposed on the first inorganic encapsulation layer; and a second inorganic encapsulation layer disposed on the organic encapsulation layer, the first inorganic encapsulation layer includes a plurality of inorganic layers, and a refractive index of one of the plurality of inorganic layers disposed on a lowermost layer is less than refractive indices of one of the plurality of inorganic layers disposed in the lowermost layer and the second inorganic encapsulation layer.

* * * * *